(12) United States Patent
Kurapov et al.

(10) Patent No.: US 9,447,488 B2
(45) Date of Patent: Sep. 20, 2016

(54) ALUMINUM TITANIUM NITRIDE COATING WITH ADAPTED MORPHOLOGY FOR ENHANCED WEAR RESISTANCE IN MACHINING OPERATIONS AND METHOD THEREOF

(71) Applicant: Oerlikon Trading AG, Trubbach, Trubbach (CH)

(72) Inventors: Denis Kurapov, Walenstadt (CH); Siegfried Krassnitzer, Feldkirch (AT)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 12 days.

(21) Appl. No.: 14/348,278

(22) PCT Filed: Sep. 19, 2012

(86) PCT No.: PCT/EP2012/003896
§ 371 (c)(1),
(2) Date: Mar. 28, 2014

(87) PCT Pub. No.: WO2013/045039
PCT Pub. Date: Apr. 4, 2013

(65) Prior Publication Data
US 2014/0287209 A1 Sep. 25, 2014

(30) Foreign Application Priority Data
Sep. 30, 2011 (EP) .................................... 11007997

(51) Int. Cl.
*C23C 14/06* (2006.01)
*C23C 30/00* (2006.01)
(Continued)

(52) U.S. Cl.
CPC ....... *C23C 14/0617* (2013.01); *C23C 14/0641* (2013.01); *C23C 14/228* (2013.01); *C23C 14/325* (2013.01); *C23C 28/04* (2013.01);
(Continued)

(58) Field of Classification Search
USPC .......... 51/307, 309; 428/216, 325, 336, 697, 428/698, 699; 204/192.15, 192.16
See application file for complete search history.

(56) References Cited

U.S. PATENT DOCUMENTS

| | | | |
|---|---|---|---|
| 2007/0218242 A1* | 9/2007 | Moriguchi | C23C 14/0641 428/98 |
| 2011/0067996 A1* | 3/2011 | Strand | C23C 14/345 204/192.15 |
| 2013/0126347 A1 | 5/2013 | Krassnitzer et al. | |

FOREIGN PATENT DOCUMENTS

| | | |
|---|---|---|
| EP | 1 616 978 A1 | 1/2006 |
| JP | 2644710 B2 | 5/1997 |

(Continued)

OTHER PUBLICATIONS

International Search Report for PCT/EP2012/003896 dated Jul. 4, 2013.

*Primary Examiner* — Archene Turner
(74) *Attorney, Agent, or Firm* — Pearne & Gordon LLP

(57) ABSTRACT

The present invention relates to an (Al,Ti)N coating exhibiting at least two different coating portions, A and B, having grain size in nanometer magnitude order characterized in that the coating portion A exhibit larger grain size and higher elastic modulus than the coating portion B. The present invention relates as well to a method for coating a substrate with a coating as described above whereby at least the coating portion A and/or the coating portion B of the (Al,Ti)N coating are/is deposited by means of PVD techniques.

26 Claims, 3 Drawing Sheets

Figure 1:
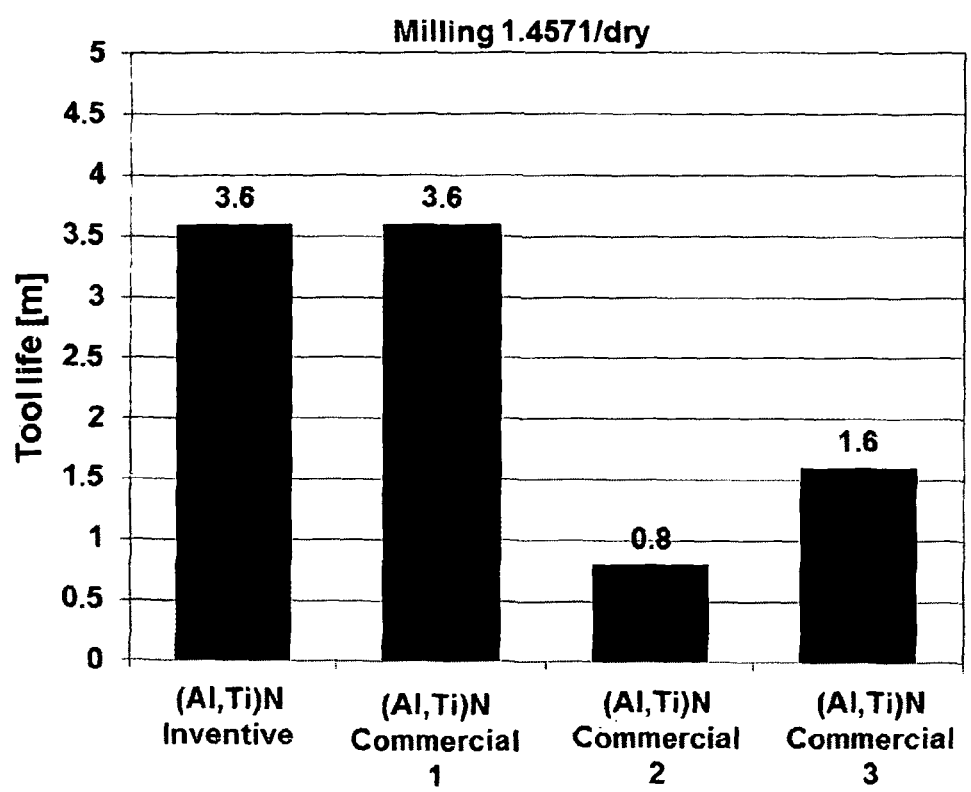

(51) Int. Cl.
*C23C 14/32* (2006.01)
*C23C 28/04* (2006.01)
*C23C 14/22* (2006.01)

(52) U.S. Cl.
CPC .............. *C23C28/044* (2013.01); *C23C 30/00* (2013.01); *C23C 30/005* (2013.01); *Y10T 428/2495* (2015.01); *Y10T 428/24983* (2015.01); *Y10T 428/24992* (2015.01); *Y10T 428/31678* (2015.04)

(56) References Cited

FOREIGN PATENT DOCUMENTS

| JP | 2011-067883 | * | 4/2001 |
| JP | 2003-113463 | * | 4/2003 |
| WO | 2008/037556 A2 | | 4/2008 |
| WO | 2011/034492 A1 | | 3/2011 |
| WO | 2011/041063 A2 | | 4/2011 |

* cited by examiner

ALUMINUM TITANIUM NITRIDE COATING WITH ADAPTED MORPHOLOGY FOR ENHANCED WEAR RESISTANCE IN MACHINING OPERATIONS AND METHOD THEREOF

The present invention relates to an aluminum titanium nitride ((Al,Ti)N) coating system and a method to deposit it on a substrate surface. More specifically, the invention relates to an aluminum titanium nitride coating having adjusted morphology and exhibiting enhanced cutting performance in machining operations.

Thin coatings comprising aluminum titanium nitride are commonly used to attain high performance of cutting tools in machining operations. The development of this kind of coatings is already since 1980 well-known. In the last time more attempts for improving the performance of aluminum titanium nitride coatings by cutting operations have been accomplished. In many cases it has been reported that by addition of other elements in monolayer coating systems (e.g. (Al,Ti,Si)N) or by combination with other coating materials in multilayered coating systems (e.g. (Al,Ti)N/Al$_2$O$_3$) it is possible to improve temperature stability, oxidation resistance and wear resistance of AlTiN-based coatings considerably. Other important aspects that have been widely investigated by development of AlTiN-based coatings are the influences of the coating crystallinity, grain size, element composition, structure, etc.

The authors of WO2011041063 reported for example that aluminum titanium nitride coatings can exhibit surprisingly good machining properties for cemented tungsten carbide cutting tools used for end milling when these coatings have between about 0 and 15 weight percent hexagonal phase and an element composition of (Al$_x$,Ti$_{1-x}$)N, where x is in the range of about 0.53 to about 0.58 moles. They indicate also that these coatings preferably have an average grain size in the range of about 10 to about 40 nanometers, exhibit cubic phase with a crystallographic texture characterized by X-ray diffraction and have a peak intensity ratio (200) to (111) in the range of about 4.5 to about 10.

The authors from JP2644710 reported that aluminum nitride coatings having element composition (AlxTi1−x)N with 0.56≤x≤0.70 exhibit high-hardness wear resistance and superior high-temperature oxidation at the same time.

The authors from WO2011034492 reported improved cutting performance or rather longer tool life of AlTiN-coated cutting tools where the aluminum titanium nitride coatings were deposited by varying substrate bias voltage sequentially during reactive PVD arc deposition from Ti0.33Al0.67 and Ti0.30 and Al0.70 Targets in nitrogen atmosphere. The deposition process according to WO2011034492 comprises at least one sequence of varying the substrate bias voltage during coating deposition (maintaining the active targets), where the sequence of varying the substrate bias voltage comprises a subsequence Si. The substrate bias voltage during the subsequence, Si, is adjusted or varied as following: a) a first substrate bias voltage, Bi, is adjusted and maintained for a deposition time, Ti, of between 10 seconds and 60 minutes, b) the substrate bias voltage is gradually changed to a second substrate bias voltage, Bi+1, during a ramping time, Ri, of between 10 seconds and 40 minutes, where |Bi−Bi+1|≥10 V. The subsequence, Si, is repeated until i=n where I=0, 1, 2 . . . n, where n≥2, and where each new subsequence starts at the same substrate bias voltage used when ending the previous subsequence.

However, despite plenty of development works within this topic, a need for improved cutting performance in machining operations drives to more extensive investigations of properties and deposition processes of aluminum titanium nitride coatings.

OBJECTIVE OF THE PRESENT INVENTION

It is an objective of the present invention to provide an aluminum titanium nitride coating system for high performance cutting tools, in particular a broadband coating for cutting inserts which allows higher productivity compared to the state of the art. Furthermore it is an objective of the present invention to provide an industrial-suited coating method for manufacturing the aforesaid high performance coated tools. Additionally the coating method according to the present invention should be as robust and uncomplicated as possible.

DESCRIPTION OF THE PRESENT INVENTION

The aforementioned objective is achieved by the present invention by providing an aluminum titanium nitride coating system having adjusted morphology and a coating deposition method thereof, both of them especially designed for improving efficiency of high performance cutting tools.

The (Ti,Al)N coating according to the present invention is a monolayer coating exhibiting two different areas or coating portions, A and B, characterized principally by different morphology structures.

The inventors found surprisingly that the cutting performance of the (Ti,Al)N coatings can be considerably improved when the coating portion A exhibits a basically more pronounced columnar morphology structure and larger grain size than the coating portion B. Furthermore better cutting performance was attained by (Ti,Al)N coatings prepared according to the invention whose grain size in both coating portions A and B was in nanometer magnitude order.

In a preferred embodiment of the present invention the grain size in the coating portion A, $gz_A$, is at least 1.25 times larger than the grain size in the coating portion B, $gz_a$, preferably $gz_A \geq 1.5 \cdot gz_B$, more preferably $10 \cdot gz_B \geq gzA \geq 1.5 \cdot gz_B$, still more preferably $4 \cdot gz_B \geq gzA \geq 1.8 \cdot gz_B$ In a further embodiment of the present invention the coating thickness of the coating portion A, $th_A$, is smaller than the coating thickness of the coating portion B, $th_B$: $th_A < th_B$. Preferably $1.2 \cdot th_A \leq th_B \leq 8 \cdot th_A$, more preferably $1.5 \cdot th_A \leq 5 th_B \leq 3 \cdot th_A$ In other further embodiment of the present invention the (Ti,Al)N coatings are produced by cathodic arc evaporation using powder metallurgical alloyed TiAl-targets as source material. Preferably atomic element composition in the targets is Ti$_x$Al$_{1-x}$ where 0.30≤x≤0.70.

In a further preferred embodiment of the present invention the magnetic field configuration on the targets surface is varied during coating deposition in order to influence the electron trajectory to the anode surface and thus the electron temperature in plasma and the ionization grade of the reactive gas in the coating chamber. According to this preferred embodiment of the present invention electron temperature and ionization grade of the reactive gas are strongly influenced during coating deposition in order to attain the different desired morphology structures A and B in the (Ti,Al)N coatings.

In other preferred embodiment of the present invention electron temperature and ionization grade of the reactive gas during deposition of the (Al,Ti)N coatings are maintained as low as possible.

Different cutting tools were coated with different versions of (Al,Ti)N coatings deposited according to the present invention and a considerably improvement of the cutting performance of cutting tools coated with (Al,Ti)N coatings according to the present invention could be verified by cutting tests. In particular a significantly reduction of crater wear and a significantly increment of tool life were attained.

Following some experimental procedures and results will be elucidated as example of an accomplishment way of the present invention:

(Al,Ti)N coatings were deposited on cutting inserts by means of arc ion plating deposition techniques. Targets having element composition of $Al_{0.55}Ti_{0.45}$, $Al_{0.6}Ti_{0.4}$, $Al_{0.67}Ti_{0.33}$ and $Al_{0.7}Ti_{0.3}$ were used as material source for the deposition of the (Al,Ti)N coatings in reactive nitrogen atmosphere. The target material was evaporated using arc evaporators of the type proposed by Krassnitzer et al. in the U.S. patent document with Ser. No. 61/357,272. This type of arc evaporators comprise a cathode (target), an anode and a magnetic means which allows to lead the streamlines of the magnetic field to the anode which is arranged in the direct neighborhood of the cathode. Electron temperature and ionization grade of the reactive gas, in this case ionization grade of the nitrogen gas in the coating chamber, were influenced in order to produce the different coating portions A and B by adjusting appropriated values of coil current. The coating portion A was deposited on the substrate, and the coating portion B was deposited on the coating portion A. In some cases an interlayer was deposited between substrate and coating portion A. In general, the used values of coil current and substrate bias voltage for deposition of the coating portions A, $cc_A$ and $sbv_A$, were higher than the corresponding used values for the deposition of the coating portions B, $cc_B$ and $sbv_B$, thus $cc_A > cc_B$ and $sbv_A > sbv_B$.

$cc_A$ and $sbv_A$ values as well as $cc_B$ and $sbv_B$ values were adjusted respectively at the beginning of each corresponding deposition of the portions A and B without using a ramp and then maintained constant respectively until each corresponding deposition time of the coating portions A and B were completed. Used coil currents varied between 0 A and 2 A.

Furthermore, deposited coatings according to the invention corresponding to the above described example were analyzed using the following analytic techniques among others: energy dispersive X-ray spectroscopy (EDX); scanning electron microscopy (SEM), X-ray diffraction (XRD) and nanoindentation methods.

Basically both portions A and B of the deposited coatings exhibit face centered cubic crystalline structures and predominantly (200) crystallographic texture. In general the observed columnar structure was more pronounced in the coating portions A than in the coating portions B. Furthermore, increased grain size, hardness and elastic modulus were observed in coating portions A in comparison with coatings portions B. Grain size values were in nanometer magnitude order. Particularly good cutting performance was observed in coatings having grain size between 5 nm and 50 nm. Hardness values varied between 37 GPa and 55 GPa. Elastic modulus values varied between 410 GPa and 450 GPa. Aluminum fraction in atomic percent related to titanium as well as compression stress measured in coating portions A were in general light lower than those measured in coating portions B.

Figure 2:
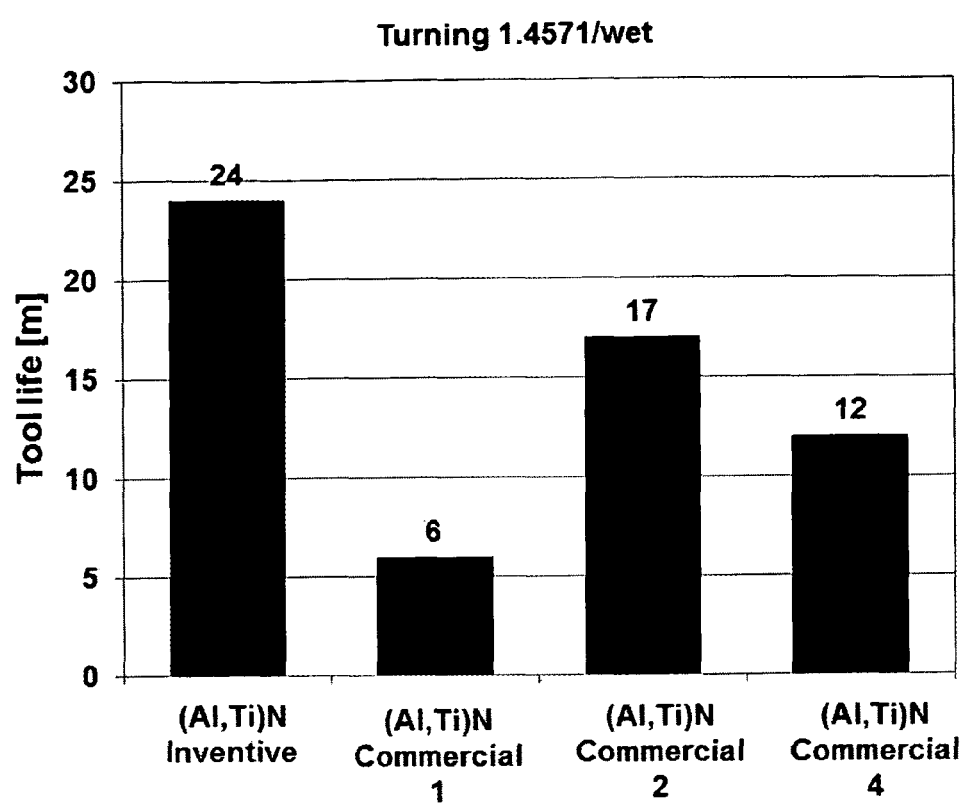

Cutting performance results of milling and turning tests using cutting inserts coated with (Al,Ti)N coatings deposited according to the present invention are shown in FIGS. 1 and 2. The attained results are displayed in the FIGS. 1-2 in comparison with other 4 different commercial established (Al,Ti)N coatings.

Figure 3:
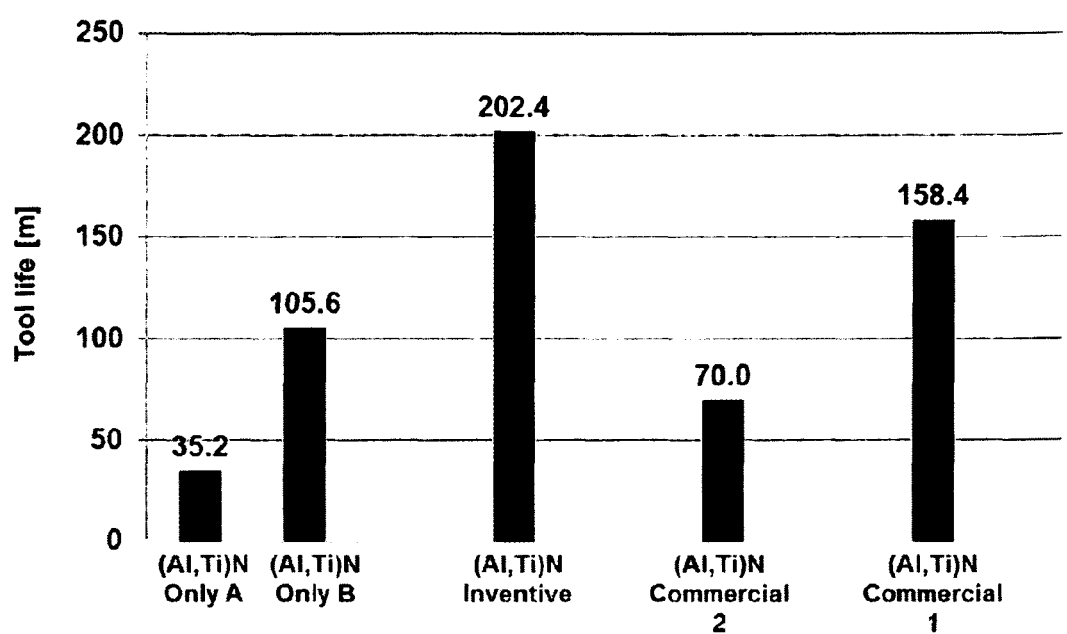

Furthermore it was verified that (Al,Ti)N coatings containing only structures corresponding to the coating portion A or the coating portion B doesn't exhibit improved high cutting performance. The results can be observed in FIG. 3.

FIGURES NOMENCLATURE

FIG. 1: Comparison of cutting performance by milling operations in cutting test 1.
Test conditions in cutting test 1 were:
Material: 1.4571
Tool: carbide insert ADKT 1505
Cutting parameters: Vc=125 m/min, fz=0.15 mm, ap=4 mm, ae=35 mm
Operation: face milling/dry FIG. 2: Comparison of cutting performance by turning operations in cutting test 2.
Test conditions in cutting test 2 were:
Material: 1.4571
Tool: CNMG432
Cutting parameters: Vc=180 m/min, fz=0.25 mm, ap=2 mm
Operation: wet cutting/outside turning
Criteria: Vbmax≥205 µm FIG. 3: Comparison of cutting performance by turning operations in cutting test 3.
Test conditions in cutting test 3 were:
Material: 1.2344 45 HRC
Tool: end-mill Ø 10 mm
Cutting parameters: Vc=180 m/min, fz=0.1 mm, ap=10 mm, ae=0.5 mm
Operation: wet cutting/finishing
Criteria: Vbmax≥100 µm In the context of the present invention the nomenclatures (Ti,Al)N coatings and (Al,Ti)N coatings have the same meaning and hence were used indistinctive.

Commonly used arc evaporators by coatings processes include a cathode but not a specific anode because the anode is constituted by the coating chamber walls. For this reason, more of the electrons generated at the cathode must go across the plasma in order to attain the anode. For this reason, more electrons arrive at the plasma during the arc PVD coating process.

In the case of the present invention, as it is mentioned above, the arc evaporator used for the production of the (Al,Ti)N coatings had an special configuration, where the anode is placed in the surroundings of the cathode and the magnetic field configuration helps also to deviate a major quantity of electrons from the cathode to the anode, avoiding that the electrons arrive at the plasma during the arc PVD process. It makes possible that a lower quantity of electrons generated at the cathode arrive at the plasma and consequently it is possible to maintain the electron temperature and ionization grade of the reactive gas in the plasma during the deposition of the (Al,Ti)N coatings as low as possible, as it was described in one of the preferred embodiments of the present invention mentioned above.

Due to the used arc evaporator with a configuration which allows the deviation of the electrons from the cathode to the anode arranged in the direct neighborhood of the cathode it was possible to generate the necessary process conditions for forming a coating having portions A and B according to the present invention by adjusting coil current and substrate bias voltage. Higher coil current values were associated with a higher deviation of the electrons from the cathode to the anode.

The applied substrate bias voltages $sbv_A$ and $sbv_B$ varied between −30 V and −200 V, with $sbv_A > sbv_B$.

According to the realized experiments, the cutting tools coated according to the present invention show particularly good cutting performance if for depositing the coating portion A of the (Al,Ti)N coating the applied substrate bias voltage is not lower than −150 V ($sbv_A$ not having a more negative value than −150 V), and for depositing the coating portion A of the (Al,Ti)N coating the applied substrate bias voltage is not lower than −200 V ($sbv_B$ not having a more negative value than −200 V). In other words, very good cutting performance can be attained according to the present invention if the bias voltage applied at the substrate during the deposition of the coating portion A is in absolute value lower than it applied during the deposition of the coating portion B.

Particularly, targets made by powder metallurgy techniques can be used for the coating deposition but also composed targets or alloyed targets made by other techniques can be used.

If it is necessary to improve the cohesiveness of the coating, it could be recommendable to adjust coating parameters such as coil current and/or bias voltage at the beginning of the deposition of the respective coating portions A and B gradually (e.g. by using a ramp).

In most instances, particularly good cutting performances were exhibited by cemented carbide cutting tools coated according to the present invention when the grain size of both coating portions A and B was lower than 30 nm. Particularly, in some cases, when the average grain size of the coating portion A was about 20 nm or less and the average grain size of the coating portion B was about 10 nm or less.

Likewise, particularly good cutting performances for some applications can be attained by coated cutting tools according to the present invention if the Al-content in atomic percentage in the coating portion A, $1-x_A$, is approximately 4-10% lower than it in the coating portion B, $1-x_B$:

if $0.04 \leq ((1-x_B)-(1-x_A))/(1-x_A) \leq 0.10$, more particularly, if $0.04 \leq ((1-x_a)-(1-x_A))/(1-x_A) \leq 0.06$ Furthermore, coatings deposited according to the present invention whose compressive stress in the coating portion A was at least 15% lower than in the portion B, preferably at least 20% lower, provided particularly good cutting performance.

A coating according to the present invention can be applied on every kind of substrate.

Particularly, a coating according to the present invention can be used for protecting surfaces that will be exposed to tribological contact.

A coating according to the present invention can also improve several tribological properties of surfaces exposed to tribological contact, such as hardness, wear resistant, oxidation resistance, etc. Particularly, a coating according to the present invention can be used for coating machine components and tools.

A coating according to the present invention can be particularly beneficial for improving cutting performance of cutting tools.

For example, the substrate of the coated cutting tools according to the present invention can comprise or can consists of steel and/or cemented carbide, and/or ceramic, and/or cubic boron nitride.

Overall coatings thickness of the (Al,Ti)N coatings deposited according to the present invention are preferably not smaller than 0.5 μm and not larger than 30 μm.

What is claimed is:

1. (Al,Ti)N coating exhibiting at least two different coating portions, A and B, having grain size in nanometer magnitude order characterized in that the coating portion A exhibits larger grain size and higher elastic modulus than the coating portion B which is deposited on the coating portion A, wherein at least one of an aluminum fraction in atomic percent related to titanium and a compression stress measured in the coating portion A is less than one of the corresponding aluminum fraction in atomic percent related to titanium and the compression stress measured in the coating portion B, the grain size in the coating portion A is between 5 nm and 50 nm, and the grain size in the coating portion A, $gz_A$, is at least 1.25 times larger than the grain size in the coating portion B, $gz_B$.

2. (Al,Ti)N coating according to claim 1, characterized in that the grain size in the coating portions A is between 5 nm and 30 nm.

3. (Al,Ti)N coating according to claim 1, characterized in that $gz_A \geq 1.5 \cdot gz_B$.

4. (Al,Ti)N coating according to claim 1, characterized in that $10 \cdot gz_B \geq gz_A \geq 1.5 \cdot gz_B$.

5. (Al,Ti)N coating according to claim 1, characterized in that $4 \cdot gz_B \geq gz_A \geq 1.8 \cdot gz_B$.

6. (Al,Ti)N coating according to claim 1, characterized in that both coating portions A and B exhibit face centered cubic crystalline structures and predominantly (200) crystallographic texture.

7. (Al,Ti)N coating according to claim 1, characterized in that both coating portions A and B exhibit hardness values between 37 GPa and 55 GPa and/or elastic modulus values between 410 GPa and 450 GPa.

8. (Al,Ti)N coating according to claim 1, characterized in that the thickness of the coating portion A, $th_A$, is smaller than the coating thickness of the coating portion B, $th_B$.

9. (Al,Ti)N coating according to claim 8, characterized in that $1.2 \cdot th_A \leq th_B \leq 8 \cdot th_A$.

10. (Al,Ti)N coating according to claim 8, characterized in that $1.5 \cdot th_A \leq th_B \leq 3 \cdot th_A$.

11. Substrate at least partially coated with an (Al,Ti)N coating according to claim 1.

12. Substrate according to claim 11, characterized in that the substrate is a tool.

13. Substrate according to claim 11, characterized in that the substrate is a cutting tool comprising at least one of steel, cemented carbide, ceramic, and cubic boron nitride.

14. Substrate according to claim 11, wherein the coating portion A is deposited on a surface of the substrate.

15. Method for coating a substrate according to claim 11, characterized in that at least the coating portion A and/or the coating portion B of the (Al,Ti)N coating are/is deposited by means of PVD techniques.

16. Method according to claim 15, characterized in that, at least for depositing the coating portion A and/or the coating portion B of the (Al,Ti)N coating, reactive arc ion plating deposition techniques are used, whereby at least one target comprising titanium and aluminum is used as source material and for the coating formation nitrogen or an essentially nitrogen comprising gas is used as a reactive gas.

17. Method according to claim 15, characterized in that at least for depositing the coating portion A and/or the coating portion B of the (Al,Ti)N coating an arc evaporator comprising a cathode, an anode arranged in the direct neighborhood of the cathode and a magnetic means is used, wherein the magnetic means allows to lead the streamlines of the magnetic field to the anode.

18. Method according to claim 15, characterized in that for depositing the coating portion A a higher coil current value is used than for depositing the coating portion B.

19. Method according to claim 15, characterized in that for depositing the coating portion B of the (Al,Ti)N coating a bias voltage having a more negative value is applied at the substrate to be coated in comparison to it applied for depositing the coating portion A.

20. PVD method for depositing a coating on a substrate, said coating having at least two different coating portions, A and B, said A and B coating portions having different grain size, the coating portion A exhibiting an average grain size larger than it in the coating portion B, characterized in that at least one of an electron temperature and ionization of the reactive gas for the coating portion A is different from at least one of the corresponding electron temperature and ionization of the reactive gas for the coating portion B.

21. PVD method according to claim 20, characterized in that, the PVD method is an reactive arc evaporation PVD method.

22. PVD method according to claim 21, characterized in that, for depositing the coating portion A and/or for depositing the coating portion B at least one arc evaporator comprising a cathode, an anode arranged in the direct neighborhood of the cathode and a magnetic means is used, wherein the magnetic means allows to lead the streamlines of the magnetic field to the anode.

23. PVD method according to claim 20, characterized in that, for depositing the coating portion A a higher coil current than for depositing the coating portion B is used.

24. PVD method according to claim 20, characterized in that, for depositing the coating portion A a negative bias voltage is applied at the substrate to be coated whose absolute value is lower than it applied for depositing the coating portion B.

25. PVD method according to claim 20, characterized in that, for depositing the coating portions A and B a same type of target material, consisting of the same elements and having same chemical composition in atomic percentage is used.

26. PVD method according to claim 20, characterized in that, at least one of the targets used for depositing the coating portions A and/or B is made by powder metallurgy techniques.

* * * * *